United States Patent [19]
Sekine et al.

[11] Patent Number: 5,694,429
[45] Date of Patent: Dec. 2, 1997

[54] MOBILE RADIO COMMUNICATION SYSTEM

[75] Inventors: Kiyoki Sekine; Toshio Kato; Manabu Kawabe; Takuro Sato, all of Tokyo, Japan

[73] Assignee: Oki Electric Industry Co., Ltd., Tokyo, Japan

[21] Appl. No.: 426,253

[22] Filed: Apr. 21, 1995

[30] Foreign Application Priority Data

Apr. 28, 1994 [JP] Japan .................... HEI 06-091914

[51] Int. Cl.$^6$ .................. H03M 13/12; H04J 13/00
[52] U.S. Cl. ............. 375/262; 375/285; 375/295; 375/341; 455/68; 455/127; 381/77; 395/2.24
[58] Field of Search .................. 375/262, 265, 375/285, 295, 298, 340–341, 346, 254; 371/43; 455/68, 70, 116, 126–127, 343; 381/2, 77; 395/2.17, 2.19, 2.23, 2.24, 2.94

[56] References Cited

U.S. PATENT DOCUMENTS

| | | | |
|---|---|---|---|
| 5,189,669 | 2/1993 | Nunokawa | 370/84 |
| 5,535,239 | 7/1996 | Padovani et al. | 375/205 |
| 5,559,832 | 9/1996 | Laird | 375/244 |
| 5,563,908 | 10/1996 | Kaku et al. | 375/222 |
| 5,577,087 | 11/1996 | Furuya | 375/377 |

FOREIGN PATENT DOCUMENTS

| | | |
|---|---|---|
| 0413505 | 2/1991 | European Pat. Off. . |
| 4216911 | 11/1992 | Germany . |

OTHER PUBLICATIONS

ICASSP-89: 1989 International Conference On Acoustics, Speech and Signal Processing, Glasgow, UK, 23.–26.05, 1989, vol. 1, 23 May 1989, IEEE, New York, U.S., pp. 369–372, D.K. Freeman / G. Cosier / C.B. Southcott / I. Boyd, "The Voice Activity Detector For The Pan–European Digital Cellular Mobile Telephone Service".

European Transactions On Telecommunications and Related Technologies, vol. 5, No. 2, March 1994, Milano, Italy, pp. 261–276, L. Hanzo / R. Steel,. "The Pan–European Mobile Radio System. Part II".

1993 43rd IEEE Vehicular Technology Conference, Secaucus, U.S., 18.–20.05, 1993, 18 May 1993, IEEE, New York, U.S., pp 104–107, R. Cox /C.E. W. Sunberg, "A Circular Viterbi Algorithm For Decoding Tailbiting Convolutional Codes".

IEEE Transactions On Communications, vol. Com–34, No. 2, Feb. 1986, New York, U.S., pp. 104–111, H.H. Ma / J.K. Wolf, "On Tail Biting Convolutional Codes".

IEEE Transactions On Communications, vol. Com–38, No. 7, Jul. 1990, New York, U.S., pp. 966–980, J. Hagenauer / N. Seshadri / C.E.W. Sunberg, "The Performance Of Rate–Compatible Punctured Convolutional Codes For Digital Mobile Radio".

TIA/EIA Interim Standard, "Mobile Station–Base Station Compatibility Standard for Dual–Mode Wideband Spread Spectrum Cellular System", Telecommunications Industry Assoc., TIA/EIA/IS–95, Jul. 1993.

"Coding Theory", 1990 Hideki IMAI, Institute of Electronic Communication Information.

*Primary Examiner*—Young T. Tse
*Attorney, Agent, or Firm*—Wenderoth, Lind & Ponack

[57] ABSTRACT

In a mobile radio communication system, at a transmitter side, when a sound-absent section is detected in sound data, transmission of the sound data is stopped, and instead, tail bits are transmitted. A transmission power is lowered to 0 (zero) or a given value other than 0 when the transmission of the tail bits is finished. The lowering of the transmission power is held until a sound-present section is detected. Convolutional encoding is effected to the sound data and the tail bits prior to transmission. At a receiver side, the variation in transmission power is monitored to control an operation of an associated component in response to the monitored power variation. Viterbi decoding is effected for decoding the convolutional code.

19 Claims, 5 Drawing Sheets

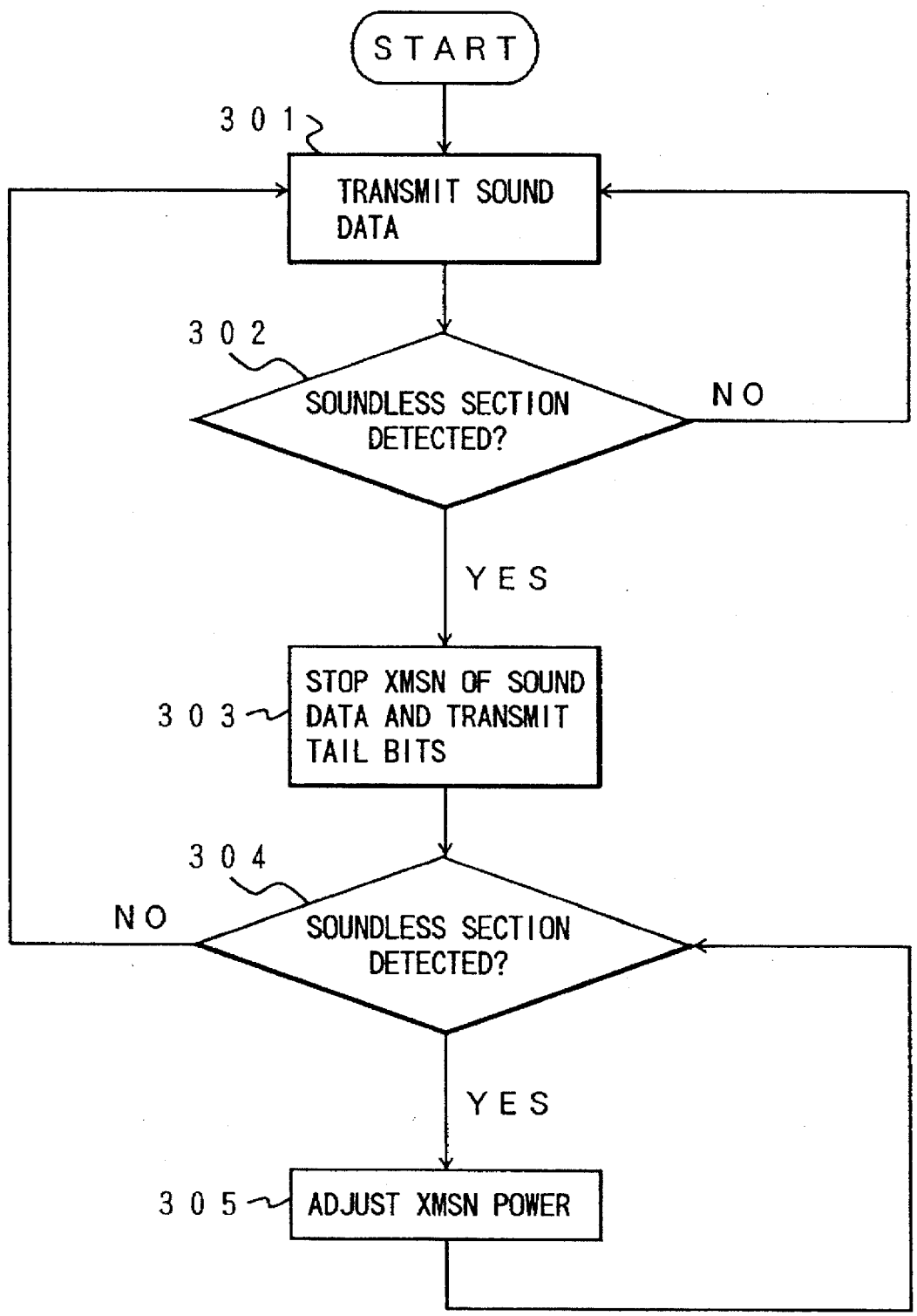

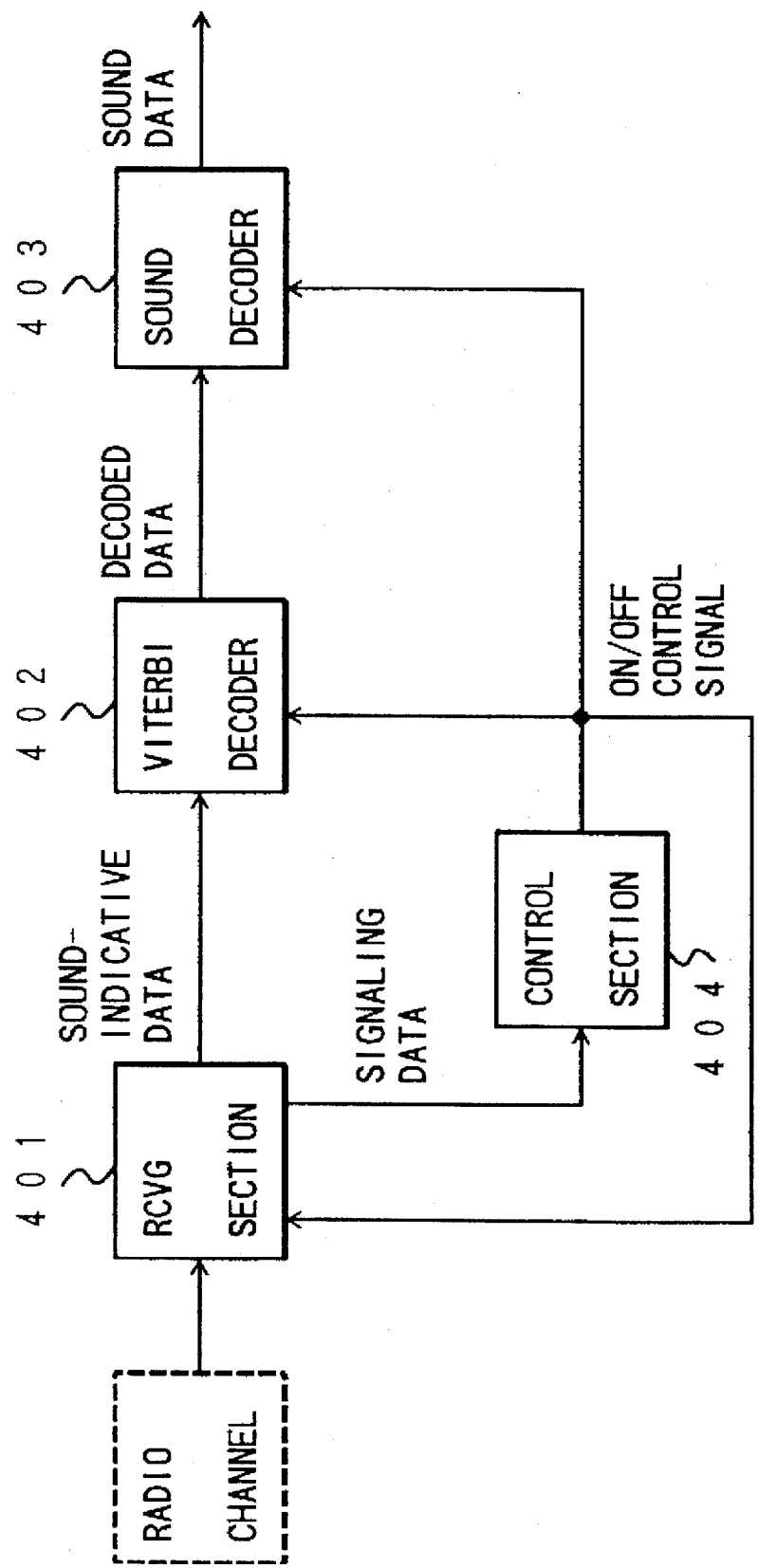

MOBILE RADIO COMMUNICATION SYSTEM

This application claims the priority right under 35 U.S.C. § 119, of Japanese Patent Application No. Hei 06-091914 filed on Apr. 28, 1994, the entire disclosure of which is incorporated herein by reference.

BACKGROUND OF THE INVENTION

1. Field of the Invention

The present invention relates to a mobile radio communication system, and more specifically, to a transmitter section and a receiver section employed at a mobile station and a base station in the mobile radio communication using the Viterbi decoding.

2. Description of the Related Art

In the mobile radio communication system, such as, the personal communication system (PCS) and the digital cellular system, the discontinuous transmission control (hereinafter referred to as "VAD/DTX control") and the Viterbi decoding have been employed. For example, the VAD/DTX control technique and the Viterbi decoding technique are disclosed in "Mobile Station-Base Station Compatiblity Standard for Dual-Mode Wideband Spread Spectrum Cellular System", TIA/EIA/IS-95, and the Viterbi decoding algorithm is disclosed in "Coding Theory", 1990, Hideki IMAI, Institute of Electronic Communication Information.

In the former literature, at the transmitter side, input data are formed into frames, as transmission units of a constant length, each having tail bits, such as, eight "0" bits at the termination thereof. The input data in the form of frames are convolutionally encoded and then transmitted on a given radio channel. At the receiver side, the transmitted convolutional code is decoded using the Viterbi decoding method. Further, at the transmitter side, particularly at the mobile station, the VAD/DTX control is performed when transmitting sound data. Specifically, input sound data are monitored for detection of a soundless or sound-absent section in the input sound data. When the soundless section is detected, the transmission power for that section is controlled to 0 (zero) or lowered to a given value other than 0.

However, in the prior art as described above, the tail bits are added to a continuous series of data bits at constant intervals to form the frames to be transmitted as transmission units. This causes a data transmission rate to be lowered. Further, such addition of the tail bits makes matching of transmission rates of the data bits and the tail bits difficult to cause complication of the hardware structure for ensuring such rate matching.

SUMMARY OF THE INVENTION

Therefore, it is an object of the present invention to provide an improved mobile station and/or an improved base station for a mobile radio communication system.

According to one aspect of the present invention, a transmitter section for a mobile radio communication comprises a discontinuous transmission control section for detecting a sound-absent section in sound data to be transmitted on a radio channel and for lowering a transmission power for the sound-absent section; a convolutional encoder for convolutionally encoding the sound data for an error correction; a tail bit generator for generating tail bits to be inserted at the sound-absent section; and a switching section for inputting one of the sound data or the tail bits into the convolutional encoder, wherein the discontinuous transmission control section controls the switching section to insert the tail bits at the sound-absent section and further controls the transmission power to be lowered for the sound-absent section where no tail bits are inserted.

According to another aspect of the present invention, a discontinuous transmission control method adapted for the Viterbi decoding in a mob fie radio communication comprises the steps of stopping transmission of sound data when detecting a sound-absent section in sound data after a sound-present section; adding tail bits after the sound-present section; and lowering a transmission power after the addition of the tail bits.

According to another aspect of the present invention, a receiver section for a mobile radio communication comprises a receiving section for separating sound-indicative data and ON/OFF information about a transmission power of the sound-indicative data, from data transmitted on a radio channel; a first decoder for inputting the sound-indicative data from the receiving section and for converting the sound-indicative data into decoded data; a second decoder for inputting the decoded data from the first decoder and converting the decoded data into sound data; and a control section for inputting the ON/OFF information from the receiving section to control the receiving section, the first decoder and the second decoder, wherein the control section, in response to the OFF information, stops the receiving section from sending the sound-indicative data to the first decoder and stops the first decoder from converting the sound-indicative data into the decoded data, while it allows the second decoder to output ambient noise instead of the sound data, and wherein the control section, in response to the ON information, allows the receiving section to send the sound-indicative data to the first decoder and allows the first decoder to convert the sound-indicative data into the decoded data so that the second decoder converts the decoded data inputted from the first decoder into the sound data.

According to another aspect of the present invention, a receiver section for a mobile radio communication comprises a receiving section for outputting sound-indicative data transmitted on a radio channel and for outputting received-power information of the sounds-indicative data; a first decoder for inputting the sound-indicative data from the receiving section to convert the sound-indicative data into decoded data and for detecting tail bits contained in the sound-indicative data; a second decoder for inputting the decoded data from the first decoder and for converting the decoded data into sound data; and a control section for inputting the received-power information from the receiving section and a result of the tail bit detection from the first decoder, the control section determining a sound-absent section or a sound-present section in the sound-indicative data based on the received-power information and the tail bit detection result, and performing an ON/OFF control of the receiving section, the first decoder and the second decoder, wherein the control section, in response to the determination of the sound-absent section, stops the receiving section from sending the sound-indicative data to the first decoder and stops the first decoder from convening the sound-indicative data into the decoded data, while it allows the second decoder to output ambient noise instead of the sound data, so as to perform the OFF control, and wherein the control section, in response to the determination of the sound-presence section, allows the receiving section to send the sound-indicative data to the first decoder and allows the first decoder to convert the sound-indicative data into the decoded data so that the second decoder converts the decoded data inputted from the first decoder into the sound data, so as to perform the ON control.

BRIEF DESCRIPTION OF THE DRAWINGS

The present invention will be understood more fully from the detailed description given hereinbelow and from the accompanying drawings of the preferred embodiments of the invention, which are given by way of example only, and are not intended to limit the present invention.

In the drawings:

FIG. 3 is a flowchart representing an operation of a VAD/DTX control section shown in FIG. 1;

FIG. 4 is a block diagram showing a structure of a receiver section corresponding to the transmitter section shown in FIG. 1, according to a preferred embodiment of the present invention.

DESCRIPTION OF THE PREFERRED EMBODIMENT

Now, preferred embodiments of the present invention will be described hereinbelow with reference to the accompanying drawings.

Before describing the preferred embodiments, brief explanation will be given hereinbelow about the VAD/DTX control and the Viterbi decoding which are employed in the following preferred embodiments.

The VAD/DTX control is used in the communication system for transmitting/receiving sound data. In the VAD/DTX control, data to be transmitted is monitored for detection of a soundless or sound-absent section in the data. When the soundless section is detected, a transmission power for that soundless section is lowered to 0 (zero) or a given value other than 0. Accordingly, in the mobile radio communication system using the VAD/DTX control, a power consumption is diminished at a transmitter side, while, at a receiver side, interference to other ongoing communications can be suppressed.

On the other hand, the Viterbi decoding is the optimum decoding method for the convolutional code and thus can easily achieve decoding of the convolutional code which is otherwise difficult to decode using the other decoding methods. Specifically, in the Viterbi decoding, a codeword which is the closest to an input string in terms of the Hamming distance is selected and outputted as a result of the decoding. For enhancing convergence or reliability of the Viterbi decoding, it is necessary to insert tail bits per unit, such as, per frame of data or a data bit stream.

In consideration of the foregoing advantages of the VAD/DTX control and the Viterbi decoding, the mobile radio communication system having both advantages or functions has been sought. However, as described above, the Viterbi decoding requires the tail bits to be inserted to the data bit stream per unit. Conventionally, this process was dealt with by changing a data transmission rate. As a result, in the system using the Viterbi decoding, the hardware structure for generating clock pulses inevitably becomes complicated.

The following preferred embodiments aim to provide the mobile radio communication system which employs the VAD/DTX control and the Viterbi decoding, while is free of the foregoing drawbacks.

Figure 1:
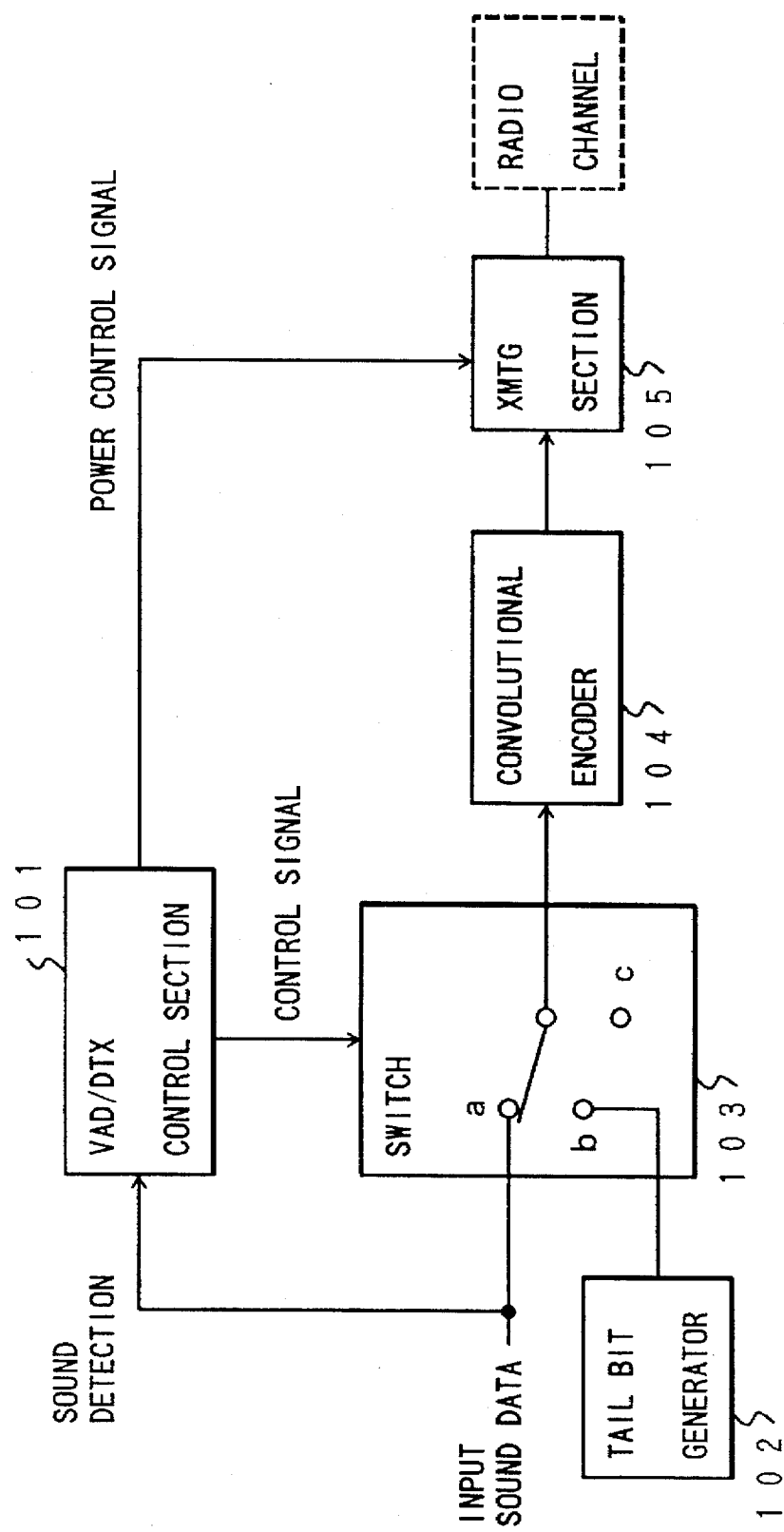
FIG. 1 is a block diagram showing a structure of a transmitter section for a mobile radio communication system according to a preferred embodiment of the present invention.

FIG. 1 shows a transmitter section in the mobile radio communication system according to a preferred embodiment of the present invention. The transmitter section shown in FIG. 1 may be used as a transmitter section of a mobile station and/or a base station for systems such as, the personal communication system or the digital cellular system.

In FIG. 1, a VAD/DTX control section 101 is connected to an input data line for receiving input sound data therefrom. The VAD/DTX control section 101 monitors the received input sound data for detection of sound contained in the input sound data. The VAD/DTX control section 101 controls operations of a switch 103 and a transmitting section 105 depending on a result of the sound detection. Specifically, when sound is detected in the input sound data, the VAD/DTX control section 101 controls the switch 103 to connect a convolutional encoder 104 to the input data line. The VAD/DTX control section 101 further performs a power control of a transmitting section 105 to allow transmission of the input sound data on a radio channel.

A tail bit generator 102 is connected to an input side of the switch 103 and produces given tail bits. On the other hand, the convolutional encoder 104 is connected to an output side of the switch 103. The convolutional encoder 104 convolutionally encodes the input sound data or the tail bits fed through the switch 103 for error correction at a receiver side.

The switch 103 has three input terminals a, b and c and connects the convolutional encoder 104 to one of the three input terminals under the control of the VAD/DTX control section 101. The input terminal a is connected to the input data line, the input terminal b is connected to the tail bit generator 102, and the input terminal c is grounded.

Figures 2A, 2B:
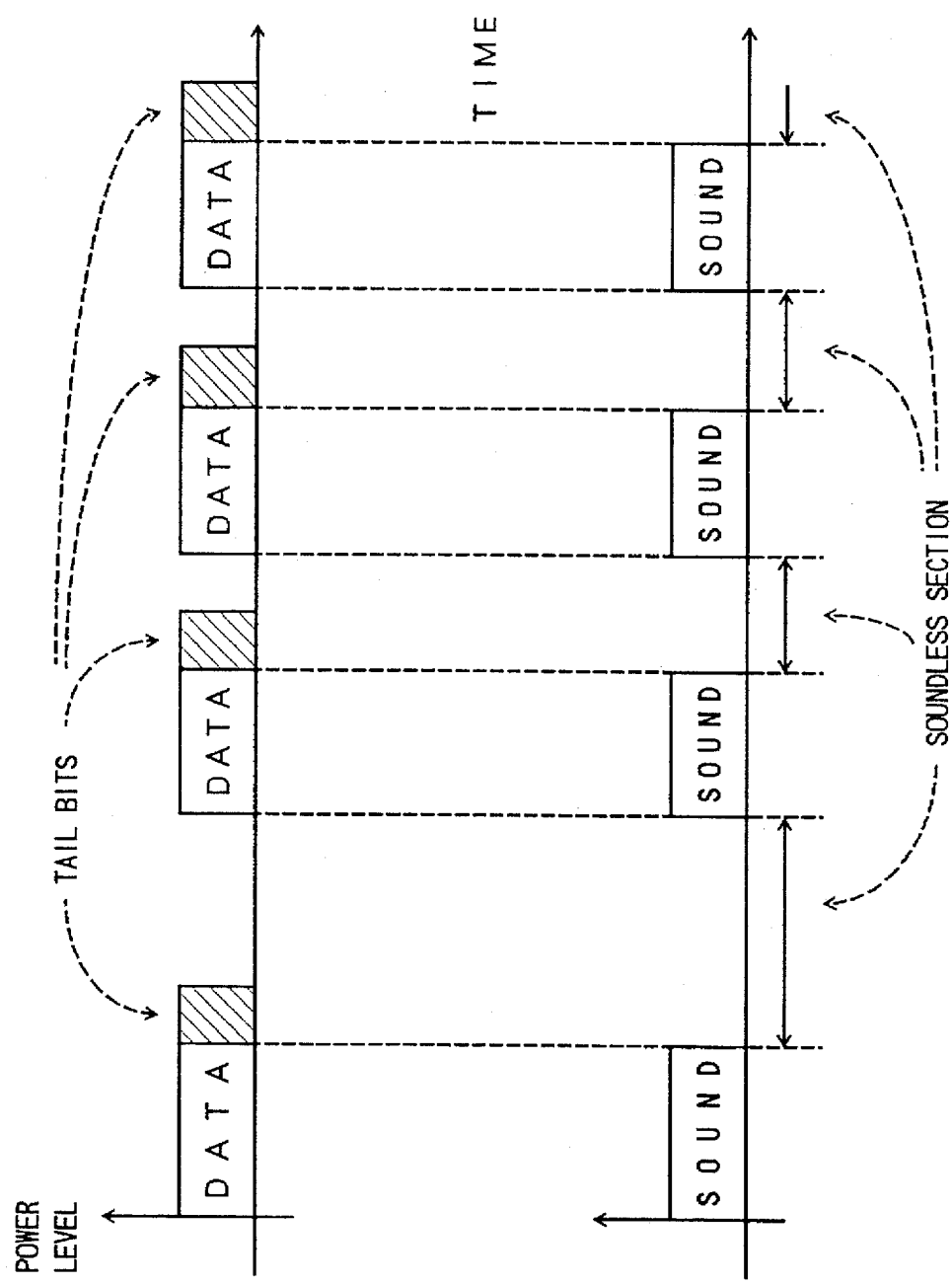
FIGS. 2A and 2B are diagrams, respectively, for explaining an insertion manner of tail bits relative to input sound data according to the preferred embodiment.

FIGS. 2A and 2B are diagrams, respectively, for explaining an insertion manner of the tail bits relative to the input sound data. FIG. 2B shows the input sound data. As appreciated from FIG. 2A, in this preferred embodiment, the tail bits, which may be eight "0" bits, are added immediately after each of sound-present sections of the input sound data which are divided by subsequent soundless or sound-absent sections. The tail bit-added data shown in FIG. 2A are transmitted from the transmitting section 105 on the radio channel.

FIG. 3 is a flowchart showing a control routine to be executed by the VAD/DTX control section 101.

In FIG. 3, at step 301, it is assumed that a sound-present section of the input sound data is now detected so that the data transmission is performed at the transmitting section 105. At this time, the input terminal a is connected to the output terminal in the switch 103. Subsequently, at step 302, the VAD/DTX control section 101 determines whether a sound-absent section is detected. If answer is negative, the routine returns to step 301 where the input terminal a is held to be connected to the output terminal in the switch 103. On the other hand, if answer at step 302 is positive, that is, the sound-absent section is detected, the routine proceeds to step 303 where the input terminal b is connected to the output terminal in the switch 103 so that the transmission of the sound data is stopped, and instead, the tail bits (a string of eight "0" bits in this preferred embodiment) produced by the tail bit generator 102 are fed to the transmitting section 105 via the convolutional encoder 104 so as to be transmitted on the radio channel.

Subsequently, the routine proceeds to step 304 where the VAD/DTX control section 101 determines whether a sound-absent section is detected. If answer at step 304 is negative, that is, a sound-present section is detected, the input terminal a is connected to transmit the input sound data at step 301. On the other hand, if answer at step 304 is positive, the routine proceeds to step 305 where the VAD/DTX control section 101 control the switch 103 to connect the input terminal c to the output terminal and further performs the power control to reduce the power to the transmitting section 105 to 0 (zero). Accordingly, no transmission is allowed from the transmitting section 105. The execution of steps 304 and 305 is repeated until answer at step 304 becomes negative.

It may be arranged that, at step 305, the transmission power is lowered to a given value other than 0. In this case, instead of connecting the input terminal c, the input terminal a is connected to the output the output terminal in the switch 103.

The sound data and the tail bits convolutionally encoded by the convolutional encoder 104 are modulated at the transmitting section 105 and sent out on the radio channel as modulated sound-indicative data. The modulated sound-indicative data are received by the receiver side and demodulated. The demodulated sound-indicative data are decoded by a Viterbi decoder at the receiver side so as to be outputted as decoded data.

It may be arranged that a communication control signal or the like is transmitted along with the above-noted modulated sound-indicative data.

FIG. 4 is a block diagram showing a structure of a receiver section corresponding to the transmitter section shown in FIG. 1, according to a preferred embodiment of the present invention. In this preferred embodiment, the transmitter section shown in FIG. 1 transmits signaling data for the communication control protocol along with the foregoing modulated sound-indicative data. The signaling data represent ON/OFF information about the transmission power of the sound-indicative data.

In FIG. 4, the receiver section includes a receiving section 401 for receiving signals from the radio channels, a Viterbi decoder 402, a sound decoder 403 and a control section 404. The receiving section 401 separates the sound-indicative data including the sound data and the tail bits, and the signaling data from the signals received from the radio channels, and outputs the sound-indicative data to the Viterbi decoder 402 and the signaling data to the control section 404. The Viterbi decoder 402 decodes the sound-indicative data to derive decoded data and outputs the decoded data to the sound decoder 403. The sound decoder 403 converts the received decoded data to sound data and outputs same.

The control section 404 operates based on the received signaling data, that is, the ON/OFF information about the transmission power caused by the VAD/DTX control. Specifically, when the OFF information is received, the control section 404 sends an OFF control signal to each of the receiving section 401, the Viterbi decoder 402 and the sound decoder 403. In response to the OFF control signal, the receiving section 401 stops sending the sound-indicative data to the Viterbi decoder 402 so that the operation of the Viterbi decoder 402 is stopped. The sound decoder 403 outputs, as sound data, ambient noise as represented by Hoth noise.

On the other hand, when the ON information is received, the control section 404 sends an ON control signal to each of the receiving section 401, the Viterbi decoder 402 and the sound decoder 403. In response to the ON control signal, the receiving section 401 sends the sound-indicative data to the Viterbi decoder 402 so that the Viterbi decoder 402 starts the operation. The sound decoder 403 stops the foregoing ambient noise and decodes the decoded data into the sound data.

Figure 5:
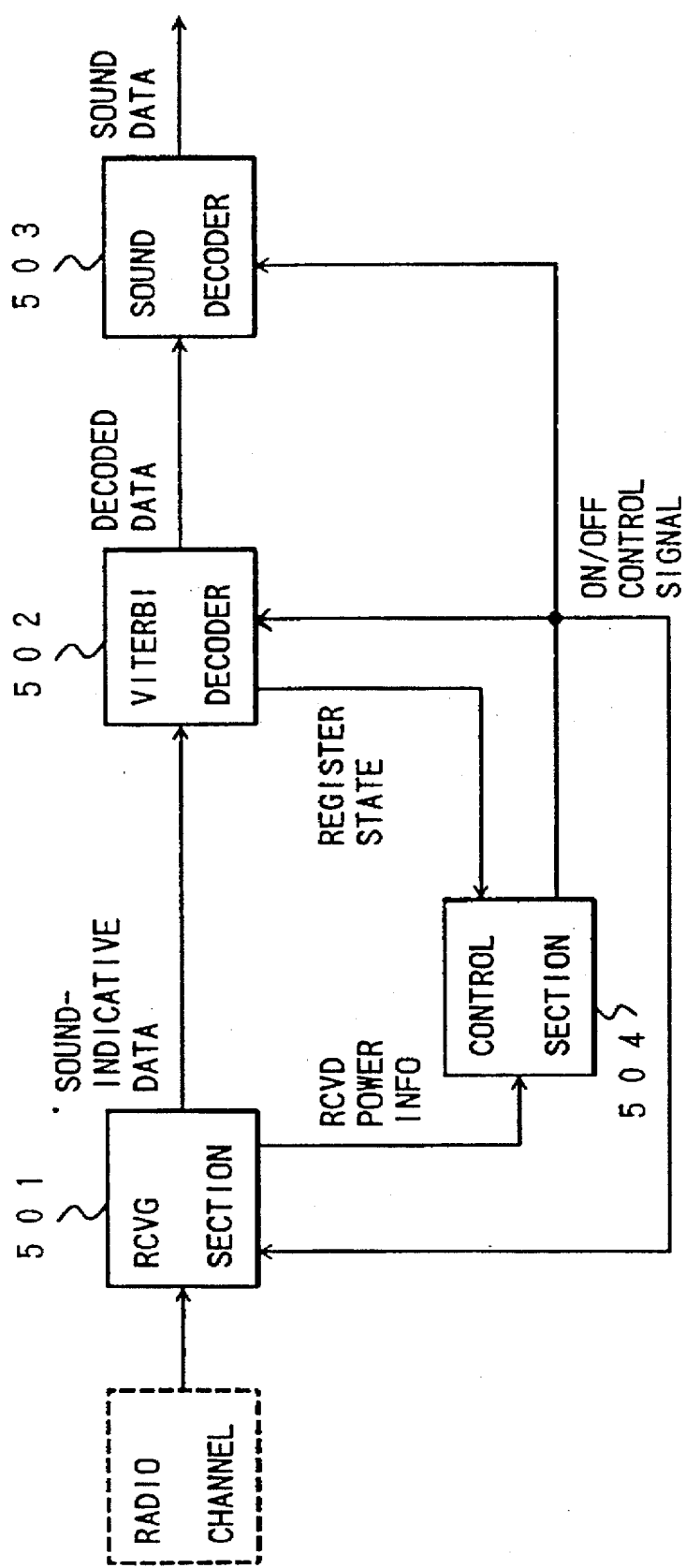
FIG. 5 is a block diagram showing a structure of a receiver section corresponding to the transmitter section shown in FIG. 1, according to another preferred embodiment of the present invention.

FIG. 5 is a block diagram showing a structure of a receiver section corresponding to the transmitter section shown in FIG. 1, according to another preferred embodiment of the present invention. In this preferred embodiment, the transmitter section shown in FIG. 1 transmits pilot signals for detection of signal synchronization and phase rotation along with the sound-indicative data.

In this preferred embodiment, the receiver section also includes a receiving section 501, a Viterbi decoder 502, a sound decoder 503 and a control section 504.

The receiving section 501 sends the sound-indicative data to the Viterbi decoder 502 and received-power information to the control section 504. The received-power information is a ratio of a received power of the signal representing the sound-indicative data relative to a received power of the prior signal. Accordingly, it represents a large value at the sound-present section and a smaller value at the sound-absent section. The Viterbi decoder 502 sends decoded data to the sound decoder 503 and a state of internal registers of the Viterbi decoder 502 to the control section 504. The sound decoder 503 converts the received decoded data into sound data.

The control section 504 determines the sound-present section or the sound-absent section based on the received-power information and the internal register state of the Viterbi decoder 502. In this preferred embodiment, the control section 504 determines the sound-absent section when the internal register state corresponds to the tail bits and the received-power information becomes equal to or smaller than a given threshold value.

When the sound-absent section is determined, the control section 504 sends an OFF control signal to each of the receiving section 501, the Viterbi decoder 502 and the sound decoder 503. In response to the OFF control signal, the receiving section stops sending the sound-indicative data to the Viterbi decoder 502 so that the Viterbi decoder 502 stops the operation. At this time, the sound decoder 503 outputs, as sound data, ambient noise as represented by Hoth noise.

On the other hand, when the sound-present section is determined, the control section 504 sends an ON control signal to each of the receiving section 501, the Viterbi decoder 502 and the sound decoder 503. In response to the ON control signal, the receiving section 501 sends the sound-indicative data to the Viterbi decoder 502 so that the Viterbi decoder starts the operation. Accordingly, the sound decoder 503 stops outputting the ambient noise and decodes the received decoded data into the sound data.

As described above, according to the foregoing preferred embodiments, the tail bits are not inserted per frame as in the prior art. Specifically, when the sound-absent section is detected, the transmission of the sound data is stopped, and instead, the tail bits are transmitted. The transmission power is lowered to 0 (zero) or the given value other than 0 when the transmission of the tail bits is finished. Accordingly, error-correction capability of the convolutional code is not deteriorated by the VAD/DTX control. Further, it is not necessary to change the transmission rate of the sound data so that the complication of the hardware structure for generating clock pulses is prevented. Specifically, a temporary shunt memory, a switching circuit and a plurality of clock circuits which have been conventionally required for the rate matching can be replaced only by a switching circuit.

Further, by performing the VAD/DTX control, the transmission power consumption at the transmitter side as well as the power consumption for the decoding process to derive the sound data at the receiver side can be lowered, and further, the interference in the radio channels can be suppressed. Accordingly, the reduction in size and weight of the mobile station can be realized with the good communication quality.

It is to be understood that this invention is not to be limited to the preferred embodiments and modifications described above, and that various changes and modifications may be made without departing from the spirit and scope of the invention as defined in the appended claims.

What is claimed is:

1. A transmitter section for a mobile radio communication system, comprising:
    a discontinuous transmission control section for detecting sound-present section and a sound-absent section in sound data to be transmitted on a radio channel and for lowering a transmission power for said sound-absent section;
    a tail bit generator for generating tail bits to be added immediately after said sound-present section;
    a switching section for selecting either said sound data or said tail bits;
    a convolutional encoder for receiving sound data and said tail bits as selected by said switching section, and for convolutionally encoding said sound data and said tail bits; and
    a transmitting section for transmitting said sound data and said tail bits as encoded data;
    wherein said discontinuous transmission control section controls said switching section to add said tail bits immediately after said sound-present section and further controls the transmission power to be lowered for said sound-absent section where no tail bits are added.

2. The transmitter section as set forth in claim 1, wherein said discontinuous transmission control section lowers the transmission power to 0 for said sound-absent section where no tail bits are inserted.

3. The transmitter section as set forth in claim 1, wherein said transmitter section is adapted for Viterbi decoding.

4. The transmitter section as set forth in claim 1, wherein said transmitter section is applied to a mobile station.

5. The transmitter section as set forth in claim 1, wherein said transmitter section is applied to a base station.

6. The transmitter section as set forth in claim 1, wherein said switching section includes a first terminal for inputting said sound data, a second terminal for inputting said tail bits from said tail bit generator, and a third terminal, and wherein said third terminal is connected to said convolutional encoder for said sound-absent section where no tail bits are added.

7. A receiver section for a mobile radio communication systems, comprising:
    a receiving section for separating sound-indicative data and ON/OFF information about a transmission power of said sound-indicative data, from data transmitted on a radio channel;
    a first decoder for inputting said sound-indicative data from said receiving section and for converting said sound-indicative data into decoded data;
    a second decoder for inputting said decoded data from said first decoder and converting said decoded data into sound data; and
    a control section for inputting said ON/OFF information from said receiving section to control said receiving section, said first decoder and said second decoder,
    wherein said control section, in response to the OFF information, stops said receiving section from sending said sound-indicative data to said first decoder and stops said first decoder from converting said sound-indicative data into said decoded data, while said control section allows said second decoder to output ambient noise instead of said sound data, and wherein said control section, in response to the ON information, allows said receiving section to send said sound-indicative data to said first decoder and allows said first decoder to convert said sound-indicative data into said decoded data so that said second decoder converts said decoded data inputted from said first decoder into said sound data.

8. The receiver section as set forth in claim 7, wherein said first decoder is a Viterbi decoder.

9. The receiver section as set forth in claim 7, wherein said ambient noise is Hoth noise.

10. The receiver section as set forth in claim 7, wherein said receiver section is applied to a mobile station.

11. The receiver section as set forth in claim 7, wherein said receiver section is applied to a base station.

12. A receiver section for a mobile radio communication systems, comprising:
    a receiving section for outputting sound-indicative data transmitted on a radio channel and for outputting received-power information of said sound-indicative data;
    a first decoder for inputting said sound-indicative data from said receiving section to convert said sound-indicative data into decoded data and for detecting tail bits contained in said sound-indicative data;
    a second decoder for inputting said decoded data from said first decoder and for converting said decoded data into sound data; and
    a control section for inputting said received-power information from said receiving section and a result of said tail bit detection from said first decoder, said control section determining a sound-absent section or a sound-present section in said sound-indicative data based on said received-power information and said tail bit detection result, and performing an ON/OFF control of said receiving section, said first decoder and said second decoder,
    wherein said control section, in response to the determination of the sound-absent section, stops said receiving section from sending said sound-indicative data to said first decoder and stops said first decoder from converting said sound-indicative data into said decoded data, while allows said second decoder to output ambient noise instead of said sound data, so as to perform said OFF control, and wherein said control section, in response to the determination of the sound-presence section, allows said receiving section to send said sound-indicative data to said first decoder and allows said first decoder to convert said sound-indicative data into said decoded data so that said second decoder converts said decoded data inputted from said first decoder into said sound data, so as to perform said ON control.

13. The receiver section as set forth in claim 12, wherein said received-power information is a ratio between a received power of a signal representing said sound-indicative data and a received power of a pilot signal.

14. The receiver section as set forth in claim 12, wherein said first decoder is a Viterbi decoder.

15. The receiver section as set forth in claim 12, wherein said ambient noise is Hoth noise.

16. The receiver section as set forth in claim 12, wherein said receiver section is applied to a mobile station.

17. The receiver section as set forth in claim 12, wherein said receiver section is applied to a base station.

18. A mobile radio communication system comprising:
(1) a base station including:
 (A) a transmitter section including:
  (a) a discontinuous transmission control section for detecting a sound-absent section in sound data to be transmitted on a radio channel and for lowering a transmission power for said sound-absent section;
  (b) a convolutional encoder for convolutionally encoding said sound data for an error correction;
  (c) a tail bit generator for generating tail bits to be inserted at said sound-absent section; and
  (d) a switching section for inputting one of said sound data or said tail bits into said convolutional encoder,
  wherein said discontinuous transmission control section controls said switching section to insert said tail bits at said sound-absent section and further controls the transmission power to be lowered for said sound-absent section where no tail bits are inserted,
 (B) a receiver section including:
  (a) a receiving section for receiving data transmitted on a radio channel and for separating sound-indicative data and ON/OFF information about a transmission power of said sound-indicative data from said received data;
  (b) a first decoder for inputting said sound-indicative data from said receiving section and for converting said sound-indicative data into decoded data;
  (c) a second decoder for inputting said decoded data from said first decoder and converting said decoded data into sound data; and
  (d) a control section for inputting said ON/OFF information from said receiving section to control said receiving section, said first decoder and said second decoder,
  wherein said control section, in response to the OFF information, stops said receiving section from sending said sound-indicative data to said first decoder and stops said first decoder from converting said sound-indicative data into said decoded data, while said control section allows said second decoder to output ambient noise instead of said sound data, and wherein said control section, in response to the ON information, allows said receiving section to send said sound-indicative data to said first decoder and allows said first decoder to convert said sound-indicative data into said decoded data so that said second decoder converts said decoded data inputted from said first decoder into said sound data,
(2) a mobile station including:
 (A) a transmitter section including:
  (a) a discontinuous transmission control section for detecting a sound-absent section in sound data to be transmitted on a radio channel and for lowering a transmission power for said sound-absent section;
  (b) a convolutional encoder for convolutionally encoding said sound data for an error correction;
  (c) a tail bit generator for generating tail bits to be inserted at said sound-absent section; and
  (d) a switching section for inputting one of said sound data or said tail bits into said convolutional encoder,
  wherein said discontinuous transmission control section controls said switching section to insert said tail bits at said sound-absent section and further controls the transmission power to be lowered for said sound-absent section where no tail bits are inserted,
 (B) a receiver section including:
  (a) a receiving section for receiving data transmitted on a radio channel and for separating sound-indicative data and ON/OFF information about a transmission power of said sound-indicative data from said received data;
  (b) a first decoder for inputting said sound-indicative data from said receiving section and for converting said sound-indicative data into decoded data;
  (c) a second decoder for inputting said decoded data from said first decoder and converting said decoded data into sound data; and
  (d) a control section for inputting said ON/OFF information from said receiving section to control said receiving section, said first decoder and said second decoder,
  wherein said control section, in response to the OFF information, stops said receiving section from sending said sound-indicative data to said first decoder and stops said first decoder from converting said sound-indicative data into said decoded data, while said control section allows said second decoder to output ambient noise instead of said sound data, and wherein said control section, in response to the ON information, allows said receiving section to send said sound-indicative data to said first decoder and allows said first decoder to convert said sound-indicative data into said decoded data so that said second decoder converts said decoded data inputted from said first decoder into said sound data.

19. A mobile radio communication system comprising:
(1) a base station including:
 (A) a transmitter section including:
  (a) a discontinuous transmission control section for detecting a sound-absent section in sound data to be transmitted on a radio channel and for lowering a transmission power for said sound-absent section;
  (b) a convolutional encoder for convolutionally encoding said sound data for an error correction;
  (c) a tail bit generator for generating tail bits to be inserted at said sound-absent section; and
  (d) a switching section for inputting one of said sound data or said tail bits into said convolutional encoder,
  wherein said discontinuous transmission control section controls said switching section to insert said tail bits at said sound-absent section and further controls the transmission power to be lowered for said sound-absent section where no tail bits are inserted, (B) a receiver section including:
  (a) a receiving section for outputting sound-indicative data transmitted on a radio channel and for outputting received-power information of said sound-indicative data;
  (b) a first decoder for inputting said sound-indicative data from said receiving section to convert said sound-indicative data into decoded data and for detecting tail bits contained in said sound-indicative data;
  (c) a second decoder for inputting said decoded data from said first decoder and for converting said decoded data into sound data; and
  (d) a control section for inputting said received-power information from said receiving section and a result of said tail bit detection from said first decoder, said control section determining a sound-absent section or a sound-present section in said sound-indicative data based on said received-power information and said tail bit detection result, and performing an ON/OFF control of said receiving section, said first decoder and said second decoder,
  wherein said control section, in response to the determination of the sound-absent section, stops said receiving section from sending said sound-indicative data to said first decoder and stops said first decoder from converting said sound-indicative data into said decoded data, while allows said second decoder to output ambient noise instead of said sound data, so as to perform said OFF control, and wherein said control section, in response to the determination of the sound-presence section, allows said receiving section to send said sound-indicative data to said first decoder and allows said first decoder to convert said sound-indicative data into said decoded data so that said second decoder converts said decoded data inputted from said first decoder into said sound data, so as to perform said ON control, (2) a mobile station including:
  (A) a transmitter section including:
    (a) a discontinuous transmission control section for detecting a sound-absent section in sound data to be transmitted on a radio channel and for lowering a transmission power for said sound-absent section;
    (b) a convolutional encoder for convolutionally encoding said sound data for an error correction;
    (c) a tail bit generator for generating tail bits to be inserted at said sound-absent section; and
    (d) a switching section for inputting one of said sound data or said tail bits into said convolutional encoder,
    wherein said discontinuous transmission control section controls said switching section to insert said tail bits at said sound-absent section and further controls the transmission power to be lowered for said sound-absent section where no tail bits are inserted,
  (B) a receiver section including:
    (a) a receiving section for outputting sound-indicative data transmitted on a radio channel and for outputting received-power information of said sound-indicative data;
    (b) a first decoder for inputting said sound-indicative data from said receiving section to convert said sound-indicative data into decoded data and for detecting tail bits contained in said sound-indicative data;
    (c) a second decoder for inputting said decoded data from said first decoder and for converting said decoded data into sound data; and
    (d) a control section for inputting said received-power information from said receiving section and a result of said tail bit detection from said first decoder, said control section determining a sound-absent section or a sound-present section in said sound-indicative data based on said received-power information and said tail bit detection result, and performing an ON/OFF control of said receiving section, said first decoder and said second decoder,
    wherein said control section, in response to the determination of the sound-absent section, stops said receiving section from sending said sound-indicative data to said first decoder and stops said first decoder from converting said sound-indicative data into said decoded data, while said control section allows said second decoder to output ambient noise instead of said sound data, so as to perform said OFF control, and wherein said control section, in response to the determination of the sound-presence section, allows said receiving section to send said sound-indicative data to said first decoder and allows said first decoder to convert said sound-indicative data into said decoded data so that said second decoder converts said decoded data inputted from said first decoder into said sound data, so as to perform said ON control.

* * * * *